United States Patent
Kim

(10) Patent No.: US 8,232,187 B2
(45) Date of Patent: Jul. 31, 2012

(54) DOPING METHOD FOR SEMICONDUCTOR DEVICE

(75) Inventor: Won-Kyu Kim, Gyeonggi-do (KR)

(73) Assignee: Hynix Semiconcuctor Inc., Gyeonggi-do (KR)

( * ) Notice: Subject to any disclaimer, the term of this patent is extended or adjusted under 35 U.S.C. 154(b) by 90 days.

(21) Appl. No.: 12/831,316

(22) Filed: Jul. 7, 2010

(65) Prior Publication Data

US 2011/0027964 A1  Feb. 3, 2011

(30) Foreign Application Priority Data

Jul. 31, 2009  (KR) .................... 10-2009-0070873

(51) Int. Cl.
*H01L 21/22* (2006.01)

(52) U.S. Cl. ............... 438/561; 438/564; 257/E21.151

(58) Field of Classification Search ............... 438/434, 438/556, 559, 560, 561; 257/E21.316
See application file for complete search history.

(56) References Cited

U.S. PATENT DOCUMENTS

| 6,133,126 A * | 10/2000 | Reisinger et al. ............ 438/564 |
| 6,921,932 B1 * | 7/2005 | Yu et al. ........................ 257/256 |
| 2007/0170543 A1 * | 7/2007 | Furukawa et al. ............ 257/520 |

* cited by examiner

*Primary Examiner* — Chandra Chaudhari
(74) *Attorney, Agent, or Firm* — IP & T Group LLP

(57) ABSTRACT

A doping method for a semiconductor device includes forming a trench in a semiconductor substrate, forming a doped layer doped with a dopant over the undoped layer, and forming a doped region into which the dopant is diffused, wherein the doped region is a portion of the semiconductor substrate in contact with the doped layer.

19 Claims, 14 Drawing Sheets

DOPING METHOD FOR SEMICONDUCTOR DEVICE

CROSS-REFERENCE TO RELATED APPLICATIONS

The present application claims priority of Korean Patent Application No. 10-2009-0070873, filed on Jul. 31, 2009, which is incorporated herein by reference in its entirety.

BACKGROUND OF THE INVENTION

Exemplary embodiments of the present invention relate to a method for fabricating a semiconductor device, and more particularly, to a doping method for a semiconductor device that may dope a particular region without performing an ion implantation process.

Ion implantation is usually used to dope a particular portion, e.g., a junction region, when a semiconductor device is fabricated. The ion implantation may control the doping depth and doping concentration.

However, as semiconductor devices become highly integrated, more complicated three-dimensional (3D) structures may be formed. In this case, if an etch process for forming a 3D structure is performed after a doping process is performed through ion implantation, it may become difficult to form a desired 3D structure because etch characteristics may become different in the area where the doping process is performed.

Therefore, the doping process may be performed through the ion implantation method after a 3D structure, such as a trench, is formed. In this case, however, a portion which is not desired to be doped, that is, an uncontrollable doping region, may be formed. Also, since the ion implantation method requires high energy and a dopant is implanted through a lattice, defects may be caused due to ion bombardment. Although the defects may be reduced through a subsequent thermal treatment, the defects are not completely removed.

Therefore, it may be difficult to form a doping region at a desired position without a defect through ion implantation.

SUMMARY OF THE INVENTION

An exemplary embodiment of the present invention is directed to a doping method for a semiconductor device that may reduce defects by doping a particular region of the semiconductor device through a diffusion process based on thermal treatment instead of an ion implantation process.

In accordance with an exemplary embodiment of the present invention, a doping method for a semiconductor device includes forming a trench in a semiconductor substrate, forming a doped layer doped with a dopant, and forming a doped region into which the dopant is diffused, wherein the doped region is a portion of the semiconductor substrate in contact with the doped layer.

In accordance with another exemplary embodiment of the present invention, a doping method for a semiconductor device includes forming a trench in a semiconductor substrate, forming an undoped layer exposing a sidewall of the trench, forming a doped layer doped with a dopant that contacts the sidewall of the trench over the undoped layer, and forming a doped region into which the dopant is diffused, wherein the doped region is in the semiconductor substrate on the sidewall of the trench which contacts the doped layer.

DESCRIPTION OF SPECIFIC EMBODIMENTS

Figure 1A:
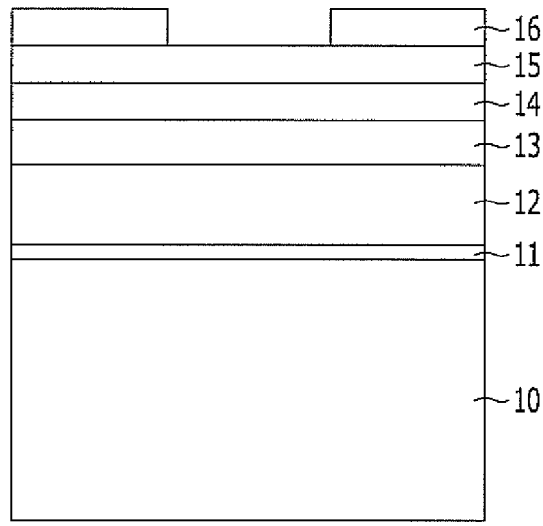
FIGS. 1A to 1M are cross-sectional views illustrating a doping method for a semiconductor device in accordance with an exemplary embodiment of the present invention.

Exemplary embodiments of the present invention will be described below in more detail with reference to the accompanying drawings. The present invention may, however, be embodied in different forms and may not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate, but also a case where a third layer exists between the first layer and the second layer or the substrate.

The technology of the present invention provides a doping method for a semiconductor device which may dope a particular region of the semiconductor device by forming a doped layer, which is doped with a dopant, adjacent to the particular region of the semiconductor device and applying heat thereto to diffuse the dopant.

FIGS. 1A to 1M are cross-sectional views illustrating a doping method for a semiconductor device in accordance with an exemplary embodiment of the present invention.

Referring to FIG. 1A, a pad insulation layer 11, a hard mask layer 12, an amorphous carbon layer 13, a silicon oxynitride layer 14, and an anti-reflection layer 15 may be sequentially deposited over a semiconductor substrate 10, and then a photoresist layer pattern 16 may be formed over the anti-reflection layer 15.

Here, the hard mask layer 12 may be formed of a nitride layer. The amorphous carbon layer 13 may be formed to secure etch margins for the layers below to be etched. The silicon oxynitride layer 14 may function both as a mask for etching the amorphous carbon layer 13 and as an anti-reflection layer. The silicon oxynitride layer 14 may be formed through a Chemical Vapor Deposition (CVD) process. The pad insulation layer 11 may be formed of an oxide layer. The photoresist layer pattern 16 may be formed through a photolithography process in such a manner that regions where trenches are to be formed are opened.

Figure 1B:
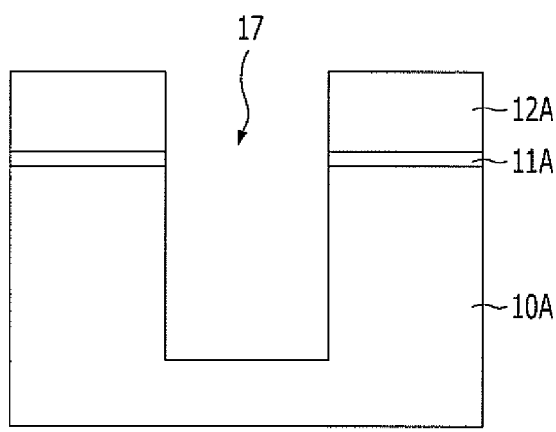

Referring to FIG. 1B, the anti-reflection layer 15, the silicon oxynitride layer 14, the amorphous carbon layer 13, and the hard mask layer 12 may be sequentially etched using the photoresist layer pattern 16 as a mask in such a manner that the regions of the pad insulation layer 11 where trenches are to be formed are opened. Subsequently, the upper layers over the hard mask layer 12, which include the photoresist layer pattern 16, the anti-reflection layer 15, the silicon oxynitride layer 14, and the amorphous carbon layer 13 may be removed. Hereafter, the etched hard mask pattern 12 will be referred to as a hard mask pattern 12A.

The upper layers for patterning the hard mask layer 12 may be mask patterns for forming trenches according to this exemplary embodiment of the present invention, however, the scope and concept of the present invention are not limited by this. The upper layers for patterning the hard mask layer 12 may be replaced with other mask elements for patterning the hard mask layer 12.

Subsequently, the pad insulation layer 11 and the semiconductor substrate 10 may be etched to a certain depth by using the hard mask pattern 12A as a mask to form trenches 17. Hereafter, the etched pad insulation layer 11 will be referred to as a pad insulation layer pattern 11A, and the etched semiconductor substrate 10 will be denoted with reference numeral '10A'.

Figure 1C:
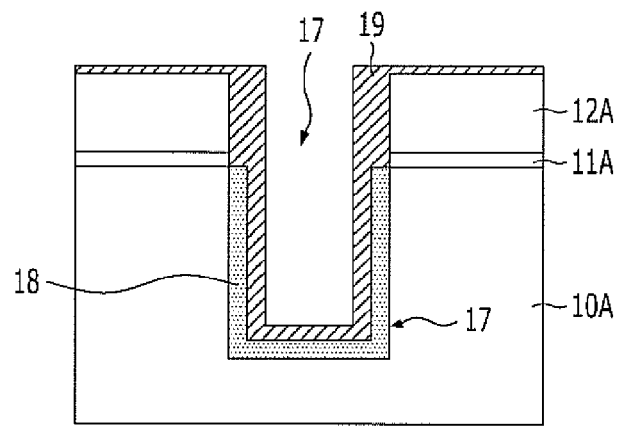

Referring to FIG. 1C, a first oxide layer 18 may be formed over the etched semiconductor substrate 10A on the surface of the trenches 17 through, for example, a wall oxidation process.

Subsequently, a first liner layer 19 may be formed over the resultant structure including the first oxide layer 18 and the hard mask pattern 12A. Here, the first liner layer 19 may be formed of a nitride layer, and the first oxide layer 18 may be formed or may not be formed.

Figure 1D:
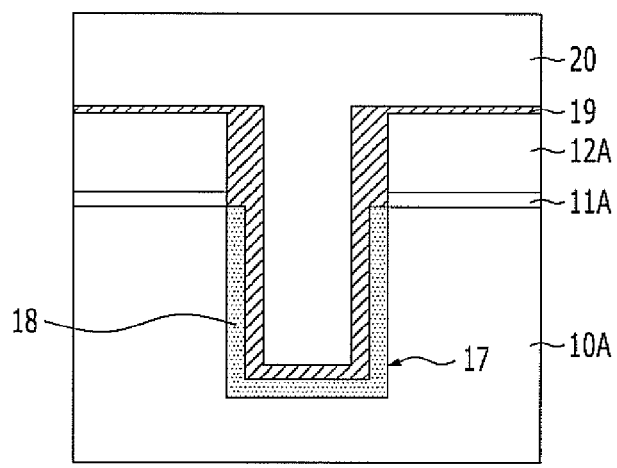

Referring to FIG. 1D, an undoped layer 20, which is not doped with a dopant, may be formed over the first liner layer 19 and may fill the trenches 17. Here, the undoped layer 20 may include a polysilicon layer that is not doped with a dopant.

Figure 1E:
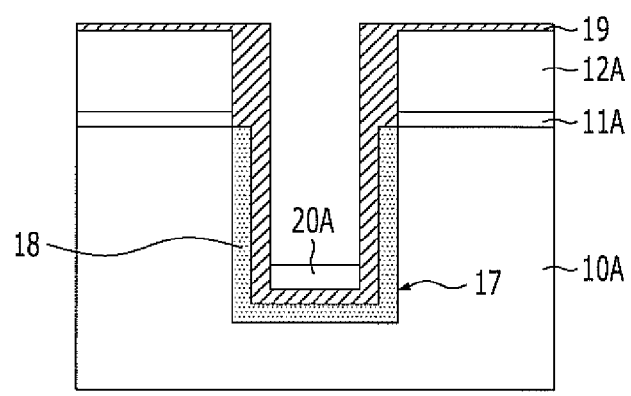

Referring to FIG. 1E, the undoped layer 20 may be partially etched back so that a portion of a desired thickness is left inside of the trenches 17. Here, a Chemical Mechanical Polishing (CMP) process may be additionally performed before the partial etch-back process in order to improve an etch uniformity of the partial etch-back process. Hereafter, the partially etched undoped layer 20 will be referred to as an undoped layer pattern 20A.

Figure 1F:
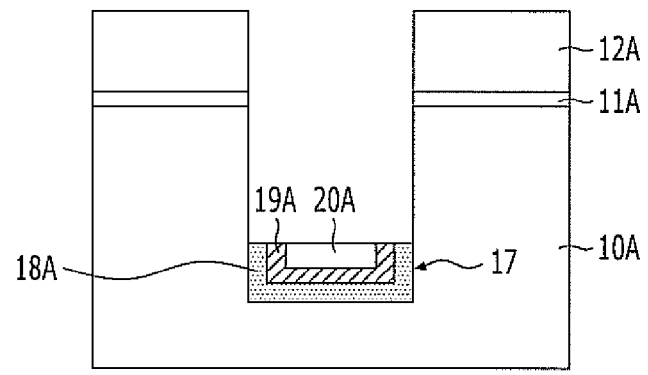

Referring to FIG. 1F, the first liner layer 19 and the first oxide layer 18 may be partially removed through a wet etch process or an etch-back process in such a manner that the partially etched first liner layer 19 and the first oxide layer 18 have, for example, substantially the same height as the undoped layer pattern 20A. Hereafter, the partially etched first liner layer 19 and the first oxide layer 18 will be referred to as a first liner layer pattern 19A and a first oxide layer pattern 18A, respectively.

Figure 1G:
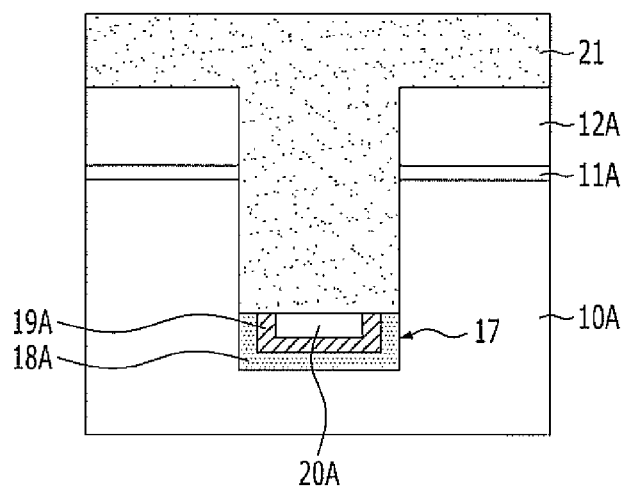

Referring to FIG. 1G, a doped layer 21, which is doped with a dopant, may be formed over the resultant structure to fill the trenches 17. Here, the doped layer 21 may include a polysilicon layer doped with a dopant. Here, the dopant may include an N-type dopant or a P-type dopant. For example, the N-type dopant may include phosphorus (P) or arsenic (As), while the P-type dopant may include boron (B).

Figure 1H:
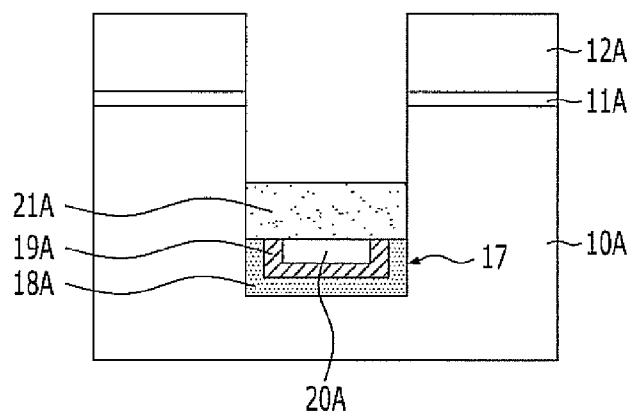

Referring to FIG. 1H, the doped layer 21 is partially etched back so that a portion of a desired thickness is left inside of each trench 17. Hereafter, the partially etched doped layer 21 will be referred to as a doped layer pattern 21A. Here, the doped layer pattern 21A may have a thickness corresponding to a doping region to be formed over the semiconductor substrate 10A during a subsequent process. Further, a CMP process may be additionally performed before the etch-back process in order to improve an etch uniformity.

Figure 1I:
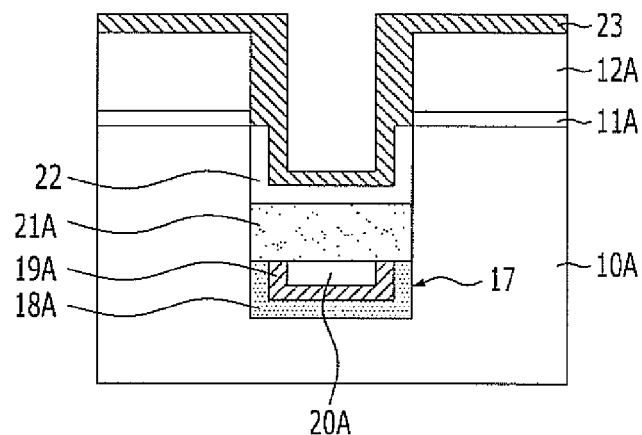

Referring to FIG. 1I, a second oxide layer 22 may be formed on the sidewalls of each trench 17 and the surface of the doped layer pattern 21A through, for example, a wall oxidation process, and a second liner layer 23 may be formed over the resultant structure including the second oxide layer 22 and the hard mask pattern 12A. Here, the second liner layer 23 may protect the doped layer pattern 21A, and the second liner layer 23 may be formed of a nitride layer. The second oxide layer 22 may be formed or may not be formed.

Figure 1J:
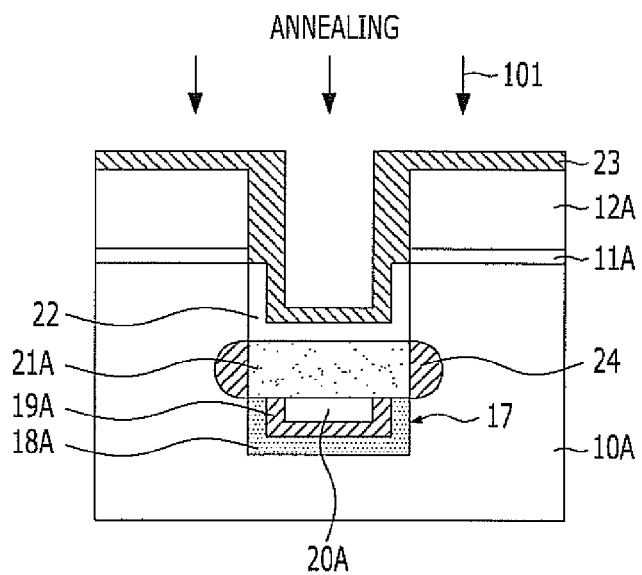

Referring to FIG. 1J, a dopant may be diffused into portions of the semiconductor substrate 10A contacting the doped layer pattern 21A (i.e., the semiconductor substrate 10A forming the sidewalls of each trench 17 in contact with the doped layer pattern 21A) through an appropriate thermal treatment 101, such as annealing. As a result, doping regions 24 may be formed in the semiconductor substrate 10A on both sidewalls of each trench 17 at a certain height. When the thermal treatment 101 is performed, the second oxide layer 22, the second liner layer 23, the first oxide layer pattern 18A, and the first liner layer pattern 19A may prevent the dopant from being diffused into an undesired position.

The thermal treatment 101 may be a furnace annealing, a rapid thermal annealing, or a combination of them. The annealing may be performed at a temperature ranging from approximately 750° C. to approximately 1,200° C. The doping regions 24 may have a doping concentration of at least $1 \times 10^{20}$ atoms/cm$^3$. To control the doping concentration of the doping regions 24, the doping concentration of the doped layer 21 may be controlled.

Figure 1K:
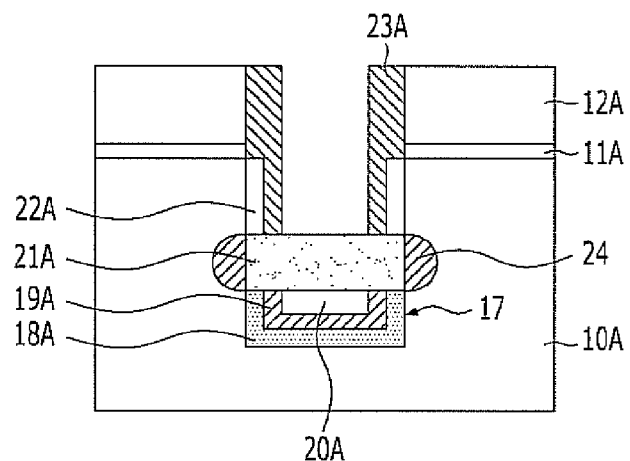

Referring to FIG. 1K, the second oxide layer 22 and the second liner layer 23, covering the upper portion of the doped layer pattern 21A and disposed over the hard mask pattern 12A, may be selectively etched through a dry etch process, such as an anisotropical etch process. Accordingly, the second oxide layer 22 and the second liner layer 23 may not be removed from the sidewalls of the trenches 17. Hereafter, the remaining second oxide layer 22 and the second liner layer 23 will be referred to as a second oxide layer pattern 22A and a second liner layer pattern 23A, respectively.

Figure 1L:
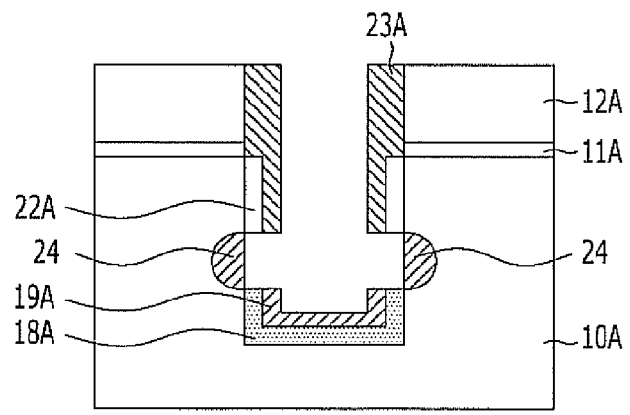

Referring to FIG. 1L, the doped layer pattern 21A and the undoped layer pattern 20A remaining inside of the trenches 17 may be etched. Here, the doping regions 24 on both sidewalls of the trench 17 in the semiconductor substrate 10A are not removed.

When the doped layer pattern 21A and the undoped layer pattern 20A formed in the trenches 17 are etched, the doping regions 24 may be separately formed in regions on each sidewall of each trench 17 at a certain height in the semiconductor substrate 10A.

Figure 1M:
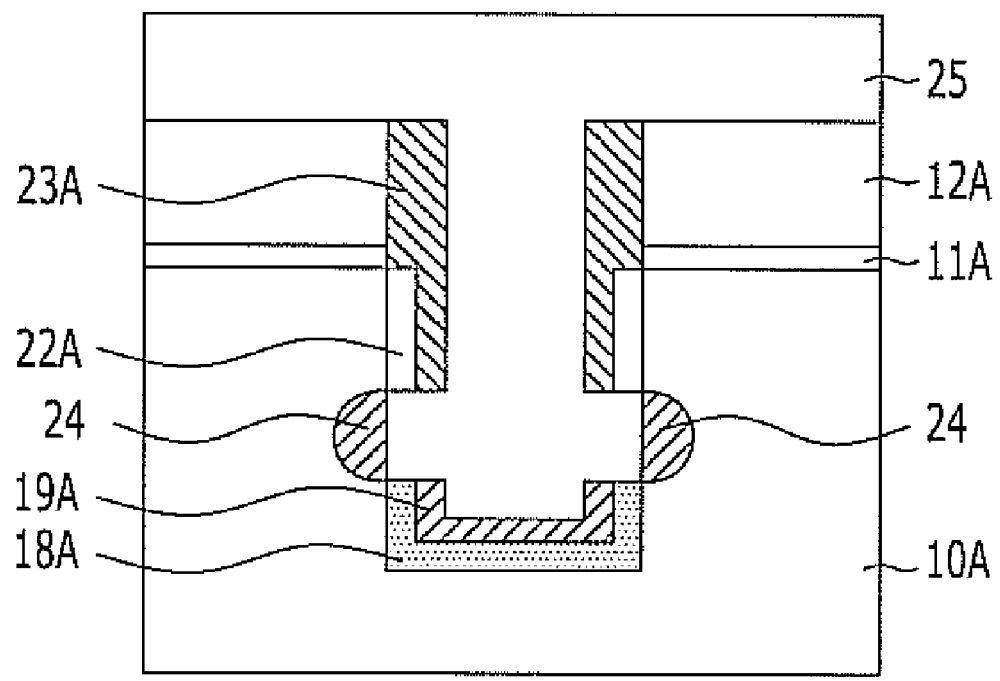

Subsequently, referring to FIG. 1M, an interlayer dielectric (ILD) layer 25 may be formed to gap-fill the trenches 17.

As described above, an exemplary embodiment of the present invention is directed to a method for forming doping regions at a particular height in both directions. Here, the doping regions 24 may be selectively formed on both sidewalls of each trench 17 in the semiconductor substrate 10A. To form the doping regions 24, the doped layer 21 may be formed with a desired thickness at a desired position in each trench 17 and formed to contact the semiconductor substrate 10. Subsequently, a thermal treatment such as annealing may be performed to diffuse the dopant, doping the doped layer 21, into the semiconductor substrate 10.

When the doping regions 24 are formed and a thermal treatment is performed to diffuse the dopant of the doped layer 21 into a particular region of the semiconductor substrate 10, it is possible to substantially prevent defects caused by ion bombardment occurring when a dopant is ion-implanted.

FIGS. 2A to 2M are cross-sectional views illustrating a doping method for a semiconductor device in accordance with another exemplary embodiment of the present invention.

Figure 2A:
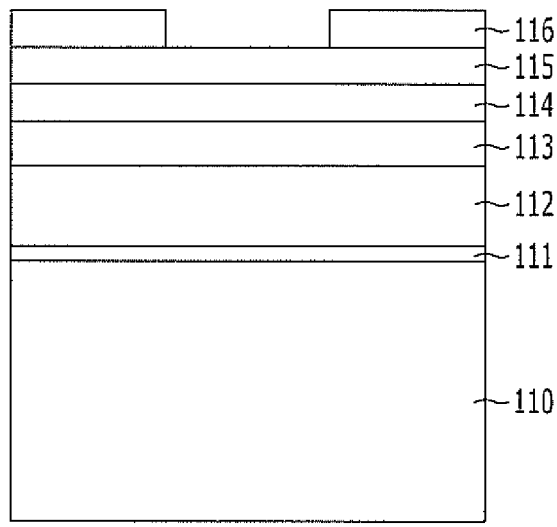
FIGS. 2A to 2M are cross-sectional views illustrating a doping method for a semiconductor device in accordance with another exemplary embodiment of the present invention.

Referring to FIG. 2A, a pad insulation layer 111, a hard mask layer 112, an amorphous carbon layer 113, a silicon oxynitride layer 114, and an anti-reflection layer 115 may be sequentially deposited over a semiconductor substrate 110, and then a photoresist layer pattern 116 may be formed over the anti-reflection layer 115.

Here, the hard mask layer 112 may be formed of a nitride layer, and the amorphous carbon layer 113 may be formed to secure etch margins of the layers below to be etched. The silicon oxynitride layer 114 may simultaneously function as a mask for etching the amorphous carbon layer 113 and as an anti-reflection layer. The silicon oxynitride layer 114 may be formed through a Chemical Vapor Deposition (CVD) method. The pad insulation layer 111 may be formed of an oxide layer. The photoresist layer pattern 116 may be formed through a photolithography process in such a manner that regions where trenches are to be formed are opened.

Figure 2B:
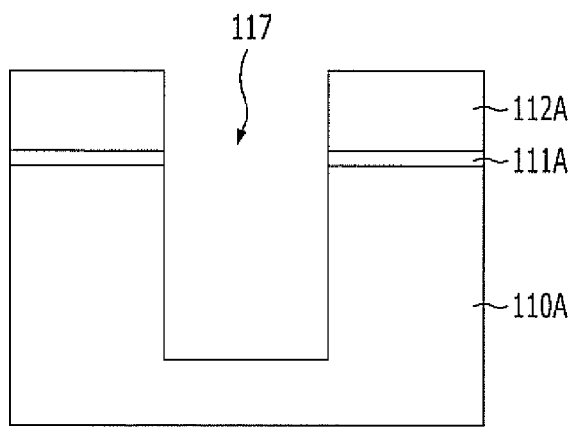

Referring to FIG. 2B, the anti-reflection layer 115, the silicon oxynitride layer 114, the amorphous carbon layer 113, and the hard mask layer 112 may be sequentially etched to open the pad insulation layer 111 in the regions where trenches are to be formed by using the photoresist layer pattern 116 as a mask. Subsequently, the photoresist layer pattern 116, the anti-reflection layer 115, the silicon oxynitride layer 114, and the amorphous carbon layer 113, which are upper layers over the hard mask layer 112 may be removed.

Hereafter, the etched hard mask layer 112 will be referred to as a hard mask pattern 112A.

The upper layers for patterning the hard mask layer 112 may be mask patterns for forming trenches according to this exemplary embodiment. The scope and concept of the present invention are not limited by this. The upper layers may be replaced with other mask layers for patterning the hard mask layer 112.

Subsequently, the pad insulation layer 111 and the semiconductor substrate 110 may be etched to a certain depth by using the hard mask pattern 112A as a mask. As a result, trenches 117 may be formed. Hereafter, the etched pad insulation layer 111 and the etched semiconductor substrate 110 will be referred to as a pad insulation layer pattern 111A and an etched semiconductor substrate 110A, respectively.

Figure 2C:
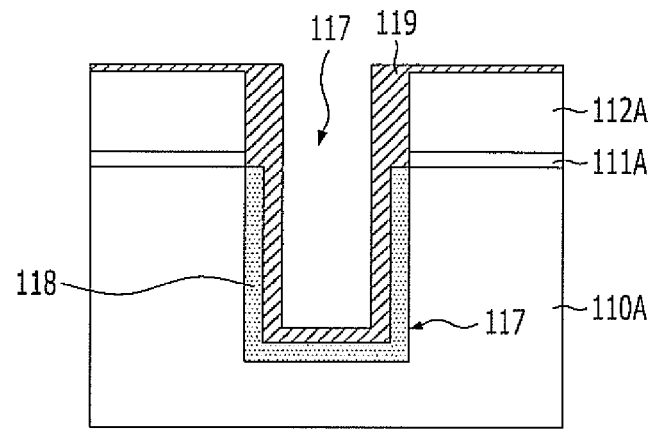

Referring to FIG. 2C, a first oxide layer 118 may be formed over the etched semiconductor substrate 110A on the surface of the trenches 117 through, for example, a wall oxidation process.

Subsequently, a first liner layer 119 may be formed over the resultant structure including the first oxide layer 118 and the hard mask pattern 112A. Herein, the first liner layer 119 may be formed of a nitride layer, and the first oxide layer 118 may be formed or may not be formed.

Figure 2D:
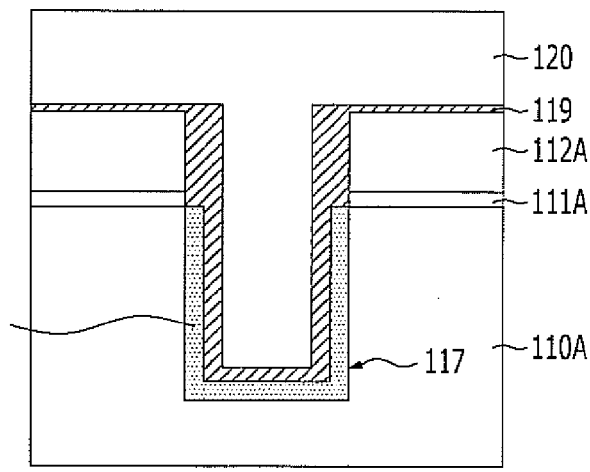

Referring to FIG. 2D, an undoped layer 120, which is not doped with a dopant, may be formed over the first liner layer 119 and may fill the trenches 117. Here, the undoped layer 120 may be formed of a polysilicon layer that is not doped with a dopant.

Figure 2E:
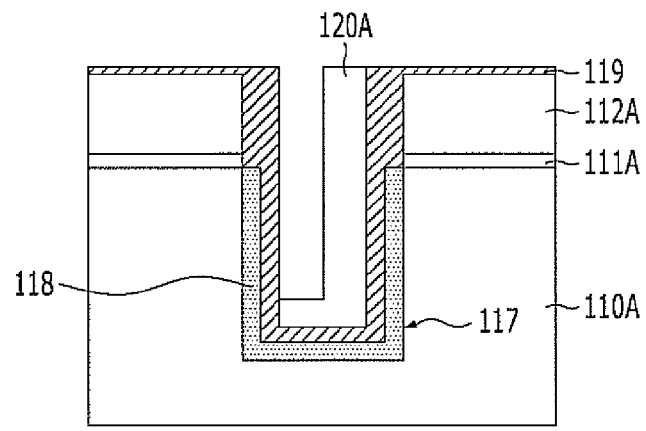

Referring to FIG. 2E, the undoped layer 120 may be partially etched back to expose one sidewall of each trench 117. Here, a CMP process may be additionally performed to the undoped layer 120, before the etch-back process, in order to improve an etch uniformity. Hereafter, the etched undoped layer 120 will be referred to as an undoped layer pattern 120A.

Figure 2F:
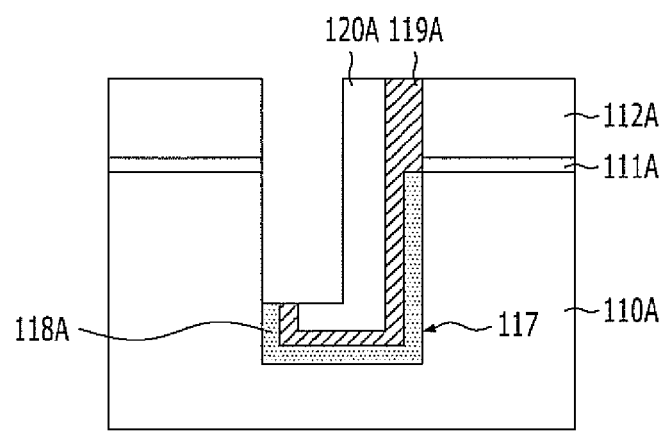

Referring to FIG. 2F, the first liner layer 119 and the first oxide layer 118 may be partially etched through a wet etch process or an etch-back process. More specifically, portions of the first liner layer 119 and the first oxide layer 118 that are not adjacent to the undoped layer pattern 120A may be etched. Hereafter, the etched first liner layer 119 and the first oxide layer 118 will be referred to as a first liner layer pattern 119A and a first oxide layer pattern 118A, respectively.

Figure 2G:
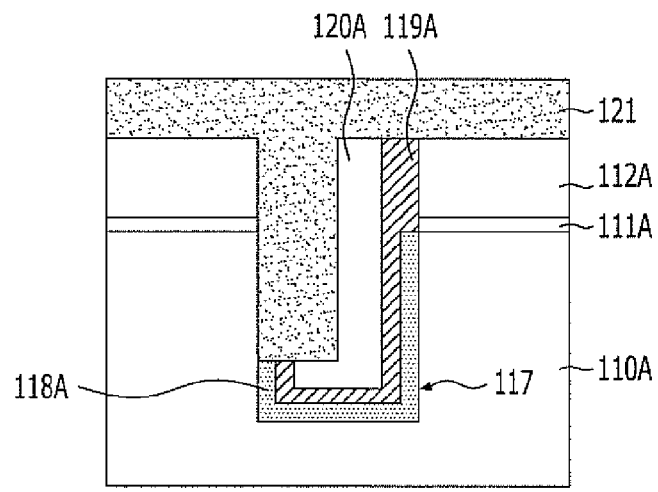

Referring to FIG. 2G, a doped layer 121, which is doped with a dopant, may be formed over the resultant structure, including the first liner layer pattern 119A and first oxide layer pattern 118A, to fill the trenches 117. Here, the doped layer 121 may be formed of a polysilicon layer doped with a dopant. The dopant may include an N-type dopant or a P-type dopant. For example, the N-type dopant may include phosphorus (P) or arsenic (As), and the P-type dopant may include boron (B).

Figure 2H:
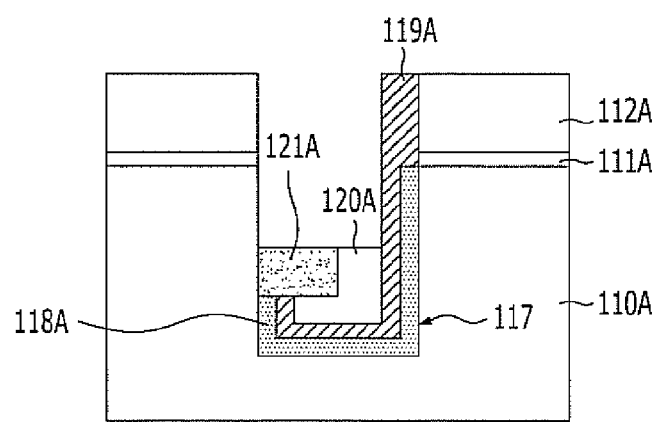

Referring to FIG. 2H, the doped layer 121 may be partially etched back so that a portion of a desired thickness is left in contact with one sidewall of the inside of each trench 117. Hereafter, the etched doped layer 121 will be referred to as a doped layer pattern 121A. Here, the doped layer pattern 121A may have a thickness corresponding to a doping region which is to be formed in the semiconductor substrate 110A on the sidewall of each trench 117. Further, a CMP process may be additionally performed before the etch-back process to improve an etch uniformity.

Figure 2I:
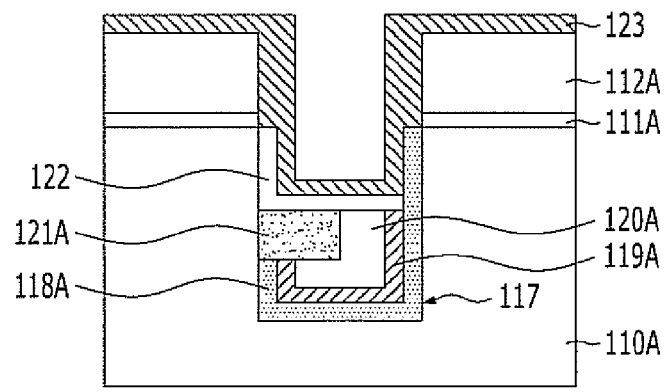

Referring to FIG. 2I, a second oxide layer 122 may be formed on one sidewall of each trench 117 and the surface of the doped layer pattern 121A through, for example, a wall oxidation process, and a second liner layer 123 may be formed over the resultant structure including the second oxide layer 122 and the hard mask pattern 112A. Here, the second liner layer 123 may protect the doped layer pattern 121A, and the second liner layer 123 may be formed of a nitride layer. The second oxide layer 122 may be formed or may not be formed.

Figure 2J:
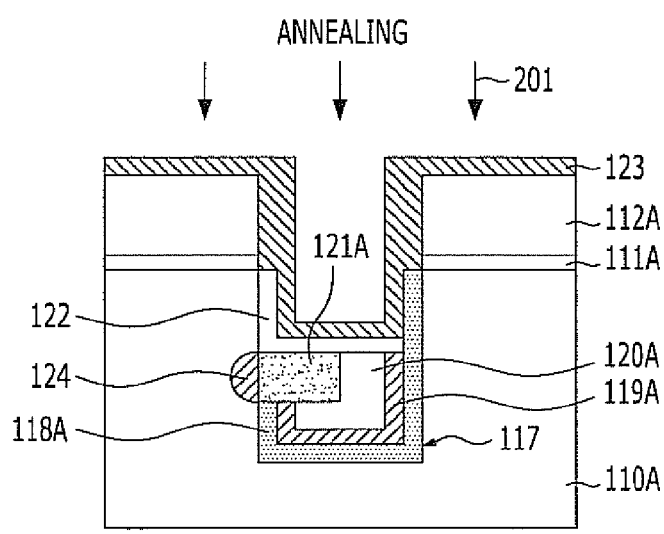

Referring to FIG. 2J, a dopant may be diffused into portions of the semiconductor substrate 110A contacting the doped layer pattern 121A (i.e., the semiconductor substrate 110A at the sidewall that is not covered by the first oxide layer pattern 118A, the second oxide layer 122, the first liner layer pattern 119A and the second liner layer 123) through a thermal treatment, such as annealing. As a result, doping regions 124 may be formed in the semiconductor substrate 110A in contact with one sidewall of each trench 117.

The thermal treatment 201 may be a furnace annealing, a rapid thermal annealing, or a combination of them. The annealing may be performed at a temperature ranging from approximately 750° C. to approximately 1,200° C. The doping regions 124 may have a doping concentration of at least $1 \times 10^{20}$ atoms/cm$^3$. To control the doping concentration of the doping regions 124, the doping concentration of the doped layer 121 may be controlled.

Figure 2K:
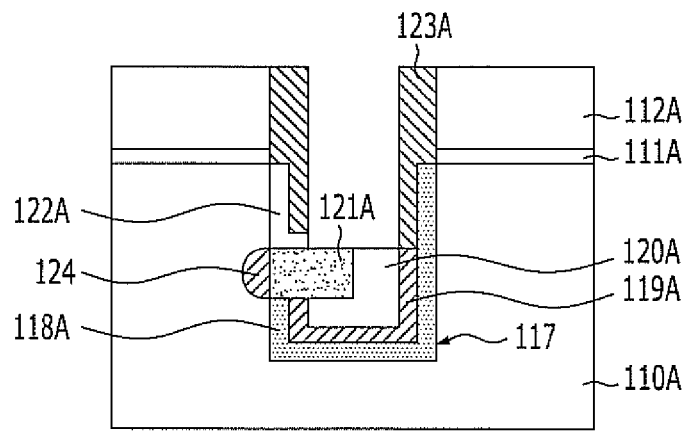

Referring to FIG. 2K, portions of the second oxide layer 122 and the second liner layer 123, which together cover the upper portions of the doped layer pattern 121A and the undoped layer 120A, and portions of the second liner layer 123, which are disposed over the hard mask pattern 112A may be selectively etched through a dry etch process, which is an anisotropical etch process. Accordingly, the second oxide layer 122 and the second liner layer 123 may not be removed from the sidewalls of the trenches 117. Hereafter, the remaining second oxide layer 122 and the remaining second liner layer 123 will be referred to as a second oxide layer pattern 122A and a second liner layer pattern 123A, respectively.

Figure 2L:
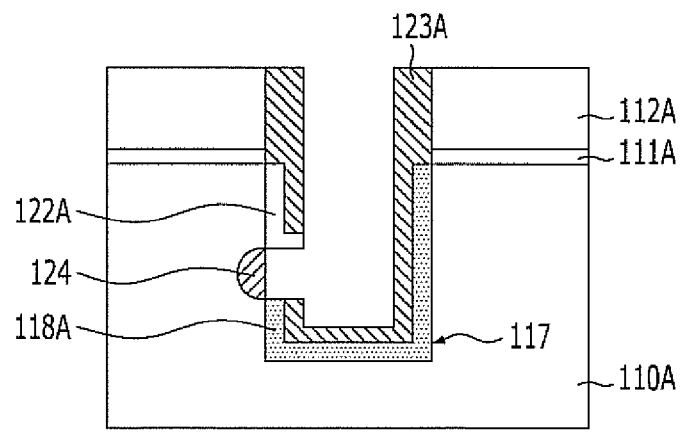

Referring to FIG. 2L, the doped layer pattern 121A and the undoped layer pattern 120A remaining in the trenches 117 may be etched. Here, the doping regions 124 formed on one sidewall of each trench 117 are not removed.

When the doped layer pattern 121A and the undoped layer pattern 120A formed in the trenches 117 are etched, the doping regions 124 may be formed in regions on one sidewall of each trench 117 at a certain height in the semiconductor substrate 10A.

Figure 2M:
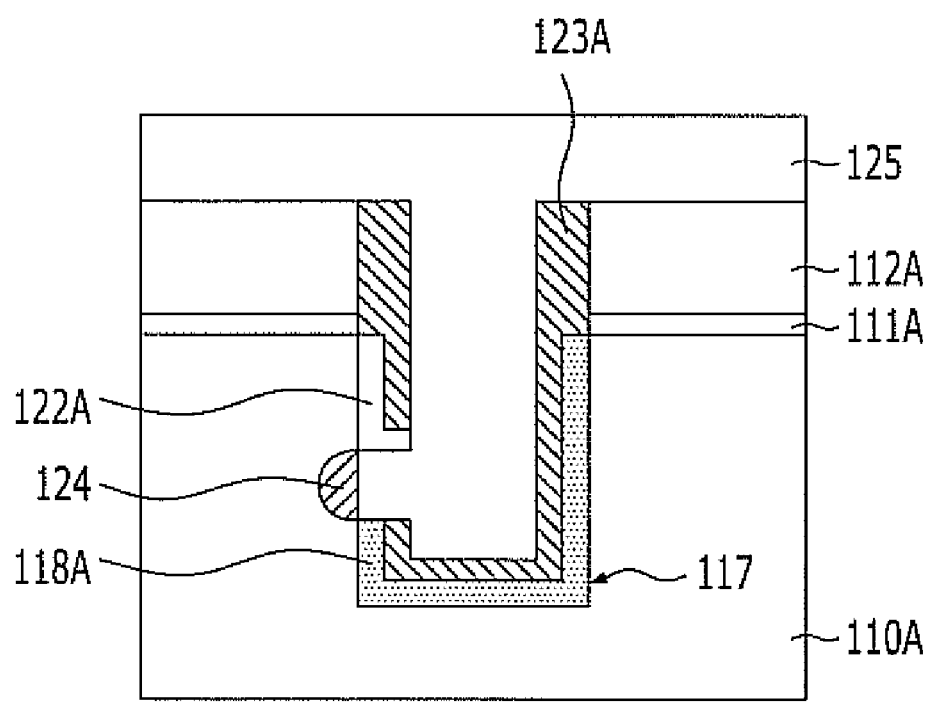

Subsequently, referring to FIG. 2M, an interlayer dielectric (ILD) layer 125 may be formed to gap-fill the trenches 117.

As described above, another exemplary embodiment of the present invention is directed to a method for forming doping regions at a particular height in one direction. The doping regions 24 may be selectively formed on one sidewall of each trench 117 at a desired height in the semiconductor substrate 10A. To form the doping regions 124, the doped layer 121 may be formed to contact one sidewall of each trench 117 with a desired thickness at a desired position so as to contact the semiconductor substrate 110A. Subsequently, a thermal treatment such as annealing may be performed to diffuse the dopant, doping the doped layer pattern 121A, into the semiconductor substrate 110A.

When the doping regions 124 are formed and a thermal treatment is performed to diffuse the dopant of the doped layer pattern 121A into a particular region of the semiconductor substrate 110A, it is possible to substantially prevent defects caused by ion bombardment occurring when a dopant is ion-implanted.

While the present invention has been described with respect to the specific embodiments, it will be apparent to those skilled in the art that various changes and modifications may be made without departing from the spirit and scope of the invention as defined in the following claims.

What is claimed is:

1. A doping method for a semiconductor device, comprising:
    forming a trench in a semiconductor substrate;
    forming an undoped layer filling a portion of the trench;
    forming a doped layer doped with a dopant over the undoped layer;
    forming a doped region into which the dopant is diffused, wherein the doped region is a portion of the semiconductor substrate in contact with the doped layer;
    removing the doped layer and the undoped layer; and
    forming an interlayer dielectric (ILD) layer gap-filling the trench.

2. The doping method of claim 1, wherein the portion of the semiconductor substrate comprises a portion of a sidewall of the trench.

3. The doping method of claim 1, wherein the undoped layer comprises a polysilicon layer not doped with a dopant.

4. The doping method of claim 1, wherein the forming of the doped layer doped with the dopant comprises:
    depositing the doped layer over the undoped layer to gap-fill the trench;
    planarizing the doped layer through a Chemical Mechanical Polishing (CMP) process; and
    performing a partial etch-back process onto the planarized doped layer.

5. The doping method of claim 4, further comprising:
    oxidizing a surface of the doped layer after the partial etch-back process.

6. The doping method of claim 1, wherein the doped layer comprises a polysilicon layer doped with a dopant.

7. The doping method of claim 1, further comprising:
    forming an insulation layer over the doped layer.

8. The doping method of claim 1, wherein the forming of a doped region comprises diffusing the dopant by performing a thermal treatment.

9. The doping method of claim 8, wherein the thermal treatment comprises an annealing process.

10. A doping method for a semiconductor device, comprising:
    forming a trench in a semiconductor substrate;
    forming an undoped layer exposing a sidewall of the trench;
    forming a doped layer doped with a dopant that contacts the sidewall of the trench over the undoped layer;
    forming a doped region into which the dopant is diffused, wherein the doped region is in the semiconductor substrate on the sidewall of the trench which contacts the doped layer;
    removing the doped layer and the undoped layer; and
    forming an interlayer dielectric (ILD) layer gap-filling the trench.

11. The doping method of claim 10, wherein the doped layer comprises a polysilicon layer doped with a dopant.

12. The doping method of claim 10, wherein the undoped layer comprises a polysilicon layer not doped with a dopant.

13. The doping method of claim 10, further comprising:
    forming an insulation layer over the doped layer.

14. The doping method of claim 10, wherein the forming of the doped layer doped with the dopant comprises:
    depositing the doped layer over the undoped layer to gap-fill the trench;
    planarizing the doped layer through a Chemical Mechanical Polishing (CMP) process; and
    performing a partial etch-back process onto the planarized doped layer.

15. The doping method of claim 14, further comprising:
    oxidizing a surface of the doped layer after the partial etch-back process.

16. The doping method of claim 10, wherein the forming of a doped region comprises diffusing the dopant by performing a thermal treatment.

17. The doping method of claim 16, wherein the thermal treatment comprises an annealing process.

18. The doping method of claim 1, further comprising:
    forming a nitride layer over the entire surface of the semiconductor substrate including the doped layer before the forming of the doped region.

19. The doping method of claim 10, further comprising:
    forming a nitride layer over the entire surface of the semiconductor substrate including the doped layer before the forming of the doped region.

* * * * *